United States Patent [19]
Ueda et al.

[11] Patent Number: 5,630,948
[45] Date of Patent: May 20, 1997

[54] METHOD FOR THE FABRICATION OF INTEGRATED CONDUCTOR SUSPENSIONS AND PRODUCT

[75] Inventors: Susumu Ueda, Tokyo, Japan; Daniel Vera, Diamond Bar, Calif.

[73] Assignee: Magnecomp Corp., Temecula, Calif.

[21] Appl. No.: 561,604

[22] Filed: Nov. 21, 1995

[51] Int. Cl.⁶ .................. B44C 1/22; C23F 1/00
[52] U.S. Cl. .................. 216/20; 216/33; 216/35; 216/41
[58] Field of Search .................. 216/13, 20, 33, 216/35, 41; 427/96; 428/209, 901; 29/846; 174/250

[56] References Cited

U.S. PATENT DOCUMENTS

| | | | |
|---|---|---|---|
| 3,801,388 | 4/1974 | Akiyama et al. | 216/20 |
| 3,841,905 | 10/1974 | Dixon | 216/20 |
| 4,606,788 | 8/1986 | Moran | 216/13 |
| 5,039,570 | 8/1991 | Sturm | 216/20 |

*Primary Examiner*—William Powell
*Attorney, Agent, or Firm*—Louis J. Bachand

[57] ABSTRACT

Integrated conductor suspensions are fabricated by progressively etching a suspension shape in a preformed laminate of copper, and stainless steel adhering to an intermediate resin layer, including defining pairs of signal lines in the copper layer having exposed sides and top, and coating these exposed sides and top with an adherent layer of gold down to the resin layer against corrosion in ambient corrosive environments.

17 Claims, 1 Drawing Sheet

METHOD FOR THE FABRICATION OF INTEGRATED CONDUCTOR SUSPENSIONS AND PRODUCT

TECHNICAL FIELD

This application relates to devices for computer disk drives, particularly disk drive load beams and suspensions therefor. More particularly, the invention relates to suspensions of the integrated conductor type in which signal lines are defined in a copper layer supported on a metal support layer through an intermediate resin layer rather than by wires. More particularly, the invention is concerned with fabrication methods for integrated conductor suspensions in which the signal lines are laterally untrammeled during fabrication to allow subsequent coating thereof with adherent gold completely on their top and lateral surfaces for maximum protection against corrosion.

BACKGROUND OF THE INVENTION

Suspensions are used to support flexures carrying slider-mounted read/write heads in close proximity to the disk in the disk drive. As the distances between disks are progressively reduced with miniaturization of disk drives and multiplication of numbers of disks in a stack, the physical space for the suspension becomes commensurately smaller while the performance demands increase, and the problems of fabricating these essential components to meet new spacing strictures become critical. The use of integrated conductors in place of wires attached to the suspension meets the need for less bulky, less difficult to assemble and more reliable components. Integrated conductors are formed by selectively etching a conductive layer to leave signal lines which replace self-supporting wires.

SUMMARY OF THE INVENTION

Definition of the integrated conductors is by a progressive etching method in which the conductive layer is stepwise shaped and configured to the desired arrangement. These components are extremely small with the suspension support having thicknesses in the range of 0.05 millimeter, and the integrated conductor thereon having a thickness of a tenth of that. Protecting integrated conductors from corrosion by ambient environment typically requires use of gold coatings over the signal lines typically defined by copper. Lack of complete coverage of the signal lines with gold permits corrosion and may result in failure of the component.

It is accordingly an object of the invention to provide a method for the fabrication of disk drive suspensions with integrated conductors. It is another object to provide such suspensions in which signal lines are defined in a conductive layer of copper. It is yet another object to provide a fabrication method for suspensions with integrated conductors in which the signal lines are laterally free to be coated with gold against exposure to corrosion by the ambient environment. Still another object is to provide a novel integrated conductor suspension in which the signal lines are protected against corrosion across their upper surfaces and completely down their lateral or side surfaces to the resin layer.

These and other objects of the invention to become apparent hereinafter are realized in a method for the fabrication of an integrated conductor suspension including defining a suspension shape in the copper layer of a preformed laminate comprising the copper layer, a metal support layer, and an adherent resin layer therebetween, shaping the resin layer to conform to the copper suspension shape, defining pairs of signal lines within the suspension shape in the copper layer in a manner leaving each of the signal lines with an exposed top and exposed sides, and coating an adherent layer of gold on the tops and sides of the signal lines in protective relation against exposure of any portion thereof to ambient corrosive environments.

In this and like embodiments, there is also included protecting the suspension shape defining portions of the copper layer of the laminate with a photoresist and etching the copper to define the shape, etching the resin layer to conform to the shape of the copper layer, defining the signal lines with photoresist on the copper and etching the copper to define the signal lines, effecting the signal line defining etching of the copper in a manner leaving the sides of the lines exposed from the top of the lines down to the resin layer, coating the adherent layer of gold across the top of the signal lines and down the sides thereof from the line top to the resin layer, defining multiple suspension shapes in a single laminate, and separating the suspension shapes from each other after coating their respective signal lines with gold, optionally further shaping the suspensions along their longitudinal or transverse axis in a manner reshaping the steel layer beneath the resin layer and the copper signal lines, and supporting the suspensions in heat exchanging contact with a heat sink during the further shaping in signal line rupture blocking relation.

In a more particularly preferred embodiment, the invention provides a method for the fabrication of an integrated conductor suspension, including defining a predetermined suspension shape in a preformed laminate comprising a copper layer, a metal support layer, and an adherent resin layer therebetween by a sequence of etching steps which successively shape the copper layer, shape the resin layer to conform to the copper suspension shape, define pairs of signal lines within the suspension shape in the copper layer in a manner leaving each of the signal lines with upwardly and laterally exposed surfaces, thereafter coating an adherent layer of gold on the exposed surfaces in protective relation against exposure of any portion thereof to ambient corrosive environments, and etching the metal support layer to conform to the suspension shape.

In this and like embodiments, typically, there is included selecting a polyimide reaction product comprising repeating units of imidized aromatic dianhydride and aromatic diamine as the resin in the resin layer of the laminate, and selecting stainless steel as the metal support layer in the laminate.

In certain embodiments, the laminate is initially supported by a relatively thick aluminum layer, and the method includes etching the aluminum layer from the laminate in advance of fabricating the laminate into an integrated conductor suspension.

In other embodiments the method further includes locally deflecting the suspension shape along its longitudinal axis to conform to a predetermined configuration.

The product of the method comprises an integrated conductor suspension comprising a suspension-shaped laminate of a copper layer, a metal support layer and an adherent resin layer therebetween, pairs of signal lines defined in the copper, the signal lines each having an exposed top and exposed sides, and a coating of gold on the tops and sides of the signal lines in protective relation against exposure of any portion thereof to ambient corrosive environments.

In this and like embodiments, typically, the metal support layer comprises a stainless steel, and the resin layer comprises a polyimide reaction product having repeating units of imidized aromatic dianhydride and aromatic diamine.

BRIEF DESCRIPTION OF THE DRAWINGS

The invention will be further described in conjunction with the attached drawings in which.

DESCRIPTION OF THE PREFERRED EMBODIMENTS

Figure 1:
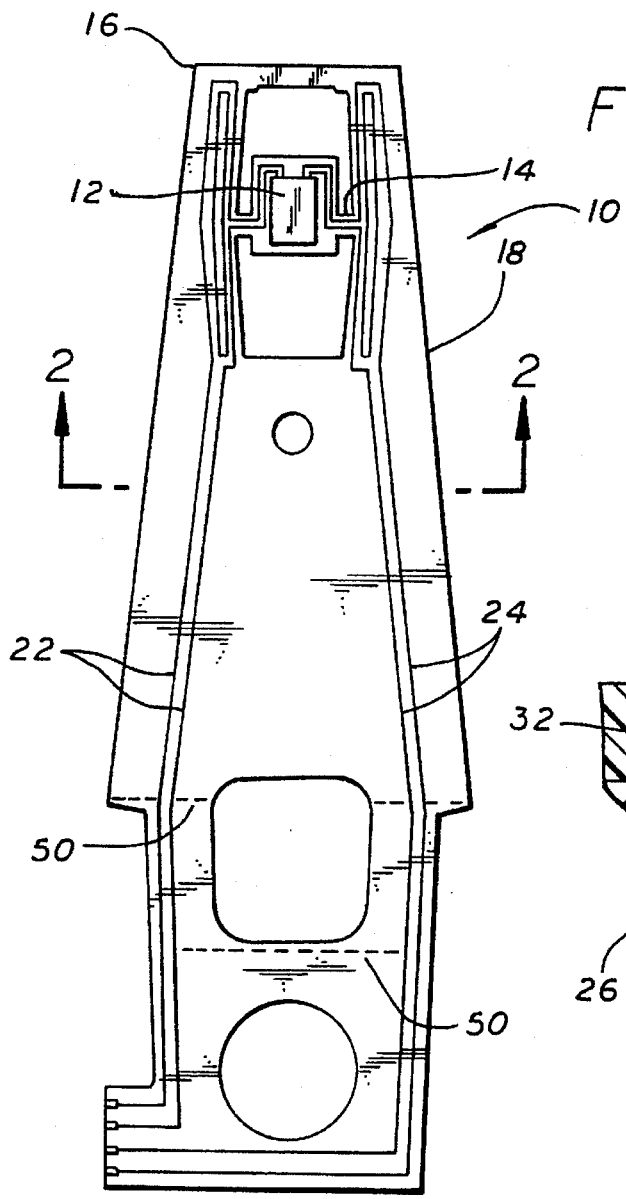
FIG. 1 is a plan view of the suspension.

With reference now to the drawings in detail, in FIG. 1, load beam 10 includes a read/write head 12 supported by gimbal structure 14 at the outer terminus 16 of the invention suspension 18. The suspension 18 is of any suitable shape and may carry any suitable head by any desired means. Suspension 18 includes for purposes of the invention two pairs of signal lines 22, 24 which are formed in situ as will be described below. Typically, one signal line pair forms part of the read circuit and the other pair a part of the write circuit.

The invention suspension 18 comprises a laminate 26 of a metal support layer 28, typically a strong, adequately flexible stainless steel as is conventionally used in these suspensions, a conductive layer 30, typically copper, and a bonding layer 32 of resin, usually a polyimide resin therebetween bonding the metal layer to the conductive layer. At the outset the laminate 26 has these several layers 28, 30 and 32 coequal in size and in full registration with each other. By a process of selective etching, noted below, the suspension 18 is shaped from the laminate 26.

The suspension 18 is of the integrated conductor type where the signal lines 22, 24 are defined in the conductive layer 30 by the selective etching of the conductor such as copper. In this manner the signal lines 22, 24 do not have to be applied using wire placement techniques which may be problematical.

Figure 3:
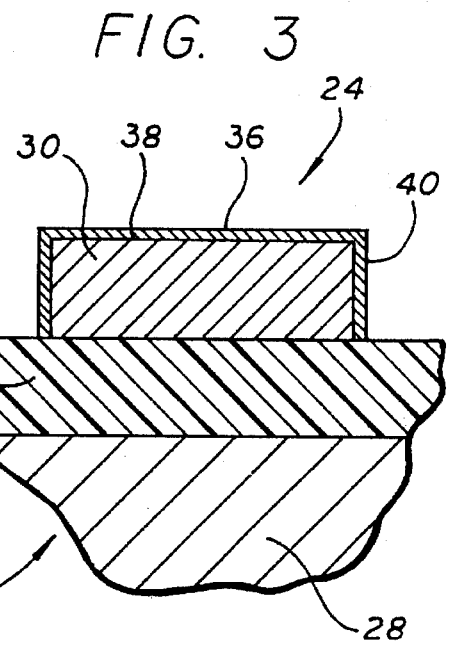
FIG. 3 is a view taken on line 3 in FIG. 2, greatly enlarged.

Importantly, in the invention method for the fabrication of the suspension 18, the signal lines 22, 24 defined in the layer 30 are untrammeled laterally by sputtered material or other obstruction which limits the availability of the signal line for subsequent coating operations, e.g. with a gold layer against corrosion. With particular reference to FIG. 3, the complete coating of the signal line 24 with gold 36 including both the line 24 top 38 and the line lateral portions or sides 40 down to the resin layer 32 is shown.

The suspension 18 is formed from the laminate 26 by first defining the FIG. 1-indicated shape of the suspension 18 in the copper layer 30 which is about 0.005 millimeter in thickness and supported by stainless steel metal support 28 of about 0.025 to 0.050 millimeter in thickness with the adherent polyimide resin layer 32 therebetween in a thickness like that of the copper layer. The resin intermediate layer 32 is typically formed of a polyimide resin comprising repeating units of imidized aromatic dianhydrides and aromatic diamine; other resins having the adhesion, chemical resistance and electronic suitability for suspension fabrication can also be used. Where the laminate is provided with a superlayer of aluminum against loss of flatness in the laminate before processing, this aluminum layer is first removed before the fabrication steps by dipping the laminate in a stripping bath of e.g. NaOH and the copper cleaned. The laminate 26 then is coated with a resist composition to protect portions of the copper layer 30 and the rest of the copper layer is removed with $FeCl_3$. The resist is then stripped with NaOH. The resin layer 32 is then removed in areas beyond the copper layer 30 with a suitable polyimide etchant. A new resist pattern is formed defining the signal lines 22, 24 on the copper layer 30, and the copper then etched with $NH_3$ and the resist is stripped with NaOH. The foregoing steps to the signal lines 22, 24 do not involve sputtering or other application of material likely to build up adjacent the signal lines, and these lines remain laterally free for the next step in the fabrication: gold plating. Gold plating is applied as a deposited layer 36 to the signal lines 22, 24 including the tops 38 and sides 40 all the way down to the resin layer 32. The entire potentially exposed area of the signal lines 22, 24 is thus gold plated, unlike in other methods of integrated conductor suspension fabrication where access to the sides 40 of the signal lines is partially blocked by sputtered material or otherwise, and portions of the signal line sides are subject to corrosion attack for want of effective gold plating in all areas of the sides.

Figure 2:
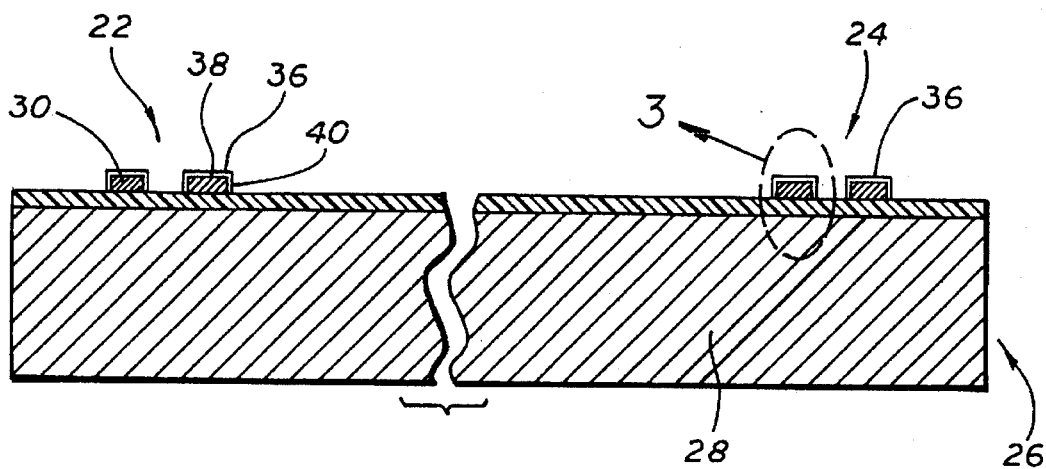
FIG. 2 is a view taken on line 2—2 in FIG. 1.

A further resist is applied to enable patterning of the suspension form and removal of excess portions of the support layer 28 around suspension 18 and between adjacent suspensions where multiple suspensions are fabricated from a single section of laminate. Suspension 18 then appears as shown in FIG. 2 particularly.

In certain embodiments the method further includes locally deflecting the suspension shape along its longitudinal axis to conform to a predetermined configuration. Where the suspension 18 shape is to have a deflection along its length as at 50, or be subjected to thermal treatments the suspension is suitably cooled or held in contact with a heat sink to prevent deterioration of the signal lines during processing.

The invention thus provides a method for the fabrication of disk drive suspensions with integrated conductors in which signal lines are defined in a conductive layer of copper and are laterally free to be coated with gold against exposure to corrosion by the ambient environment. The invention further provides a novel integrated conductor suspension in which the signal lines are protected against corrosion across their upper surfaces and completely down their lateral or side surfaces to the resin layer. The foregoing objects of the invention are thus met.

We claim:

1. Method for the fabrication of an integrated conductor suspension in a preformed laminate comprising a copper layer, a metal support layer, and an adherent resin layer therebetween, including defining a suspension shape in said copper layer, shaping said resin layer to conform to said copper suspension shape, defining pairs of signal lines within said suspension shape in said copper layer in a manner leaving each of said signal lines with an exposed top and exposed sides, and coating an adherent layer of gold on said tops and sides of said signal lines in protective relation against exposure of any portion thereof to ambient corrosive environments.

2. The method according to claim 1, including also protecting said suspension shape defining portions of said copper layer of said laminate with a photoresist and etching said copper to define said shape.

3. The method according to claim 1, including also etching said resin layer to conform to the shape of said copper layer.

4. The method according to claim 1, including also defining said signal lines with photoresist on said copper and etching said copper to define said signal lines.

5. The method according to claim 4, including also effecting said signal line defining etching of said copper in a manner leaving the sides of said lines exposed from said top of said lines down to said resin layer.

6. The method according to claim 5, including coating said adherent layer of gold across the top of said signal lines and down the sides thereof from said line top to said resin layer.

7. The method according to claim 1, including also defining multiple suspension shapes in a single laminate, and separating the suspensions shapes from each after coating their respective signal lines with gold.

8. The method according to claim 7, including also further shaping said suspensions along their longitudinal or transverse axis in a manner reshaping the steel layer beneath said resin layer and said copper signal lines.

9. The method according to claim 8, including also supporting said suspensions in heat exchanging contact with a heat sink during said further shaping in signal line rupture blocking relation.

10. Method for the fabrication of an integrated conductor suspension, including defining a suspension shape in a preformed laminate comprising a copper layer, a metal support layer, and an adherent resin layer therebetween by a sequence of etching steps which successively shape said copper layer, shape said resin layer to conform to said copper suspension shape, and define pairs of signal lines within said suspension shape in said copper layer in a manner leaving each of said signal lines with an exposed top and exposed sides, thereafter coating an adherent layer of gold on said tops and sides of said signal lines in protective relation against exposure of any portion thereof to ambient corrosive environments, and etching said metal support layer to conform to said suspension shape.

11. The method according to claim 10, including also selecting a polyimide reaction product comprising repeating units of imidized aromatic dianhydride and aromatic diamine as the resin in said resin layer of said laminate.

12. The method according to claim 10, including also selecting stainless steel as said steel layer in said laminate.

13. The method according to claim 10, in which said laminate is initially supported by a relatively thick aluminum layer, and including also etching said aluminum layer from said laminate in advance of shaping said laminate supporting said laminate in advance of fabricating said laminate.

14. The method according to claim 10, including also locally deflecting said suspension shape along its longitudinal axis to conform to a predetermined configuration.

15. An integrated conductor suspension comprising a suspension-shaped laminate of a copper layer, a metal support layer and an adherent resin layer therebetween, pairs of signal lines defined in said copper, said signal lines each having an exposed top and exposed sides, and a coating of gold on said tops and sides of said signal fines in protective relation against exposure of any portion thereof to ambient corrosive environments.

16. The integrated conductor suspension according to claim 15, in which said metal support layer comprises a stainless steel.

17. The integrated conductor suspension according to claim 15, in which said resin layer comprises a polyimide reaction product having repeating units of imidized aromatic dianhydride and aromatic diamine.

* * * * *